US005130657A

United States Patent [19]

Hornung

[11] Patent Number: 5,130,657

[45] Date of Patent: Jul. 14, 1992

[54] AIR BYPASS VALVE TESTER

[76] Inventor: Thomas F. Hornung, 144 Wimbleton Dr., Birmingham, Mich. 48009

[21] Appl. No.: 633,315

[22] Filed: Dec. 24, 1990

[51] Int. Cl.[5] .............................. G01R 31/02

[52] U.S. Cl. .............................. 324/415; 324/503; 324/418; 137/554

[58] Field of Search .............. 324/415, 418, 420, 423, 324/503; 340/644; 137/554

[56] References Cited

U.S. PATENT DOCUMENTS

| | | | |
|---|---|---|---|
| 3,646,438 | 2/1972 | Staff | 324/503 X |
| 4,764,727 | 8/1988 | McConchie, Sr. | 324/503 |
| 4,764,729 | 8/1988 | Yakawa et al. | 324/418 X |

FOREIGN PATENT DOCUMENTS

| | | | |
|---|---|---|---|
| 0240669 | 10/1987 | European Pat. Off. | 324/418 |

*Primary Examiner*—Jack B. Harvey
*Attorney, Agent, or Firm*—Reising, Ethington, Barnard, Perry & Milton

[57] ABSTRACT

A tester for a vehicle engine idle air control system includes an air bypass valve operated by a solenoid which receives a pulse width modulated signal to control the degree of opening of the valve. The tester is inserted in the vehicle wiring harness and includes a manually controlled pulse width modulator for generating a test voltage to the solenoid. A switch is connected within the tester to switch between engine computer control or manual modulator control of the solenoid. A bar graph display monitors the voltage supplied to the solenoid to indicate the magnitude thereof. The bar graph display also indicates the occurrence of short or open circuits.

5 Claims, 2 Drawing Sheets

AIR BYPASS VALVE TESTER

TECHNICAL FIELD

The invention relates to a test apparatus; more particularly it relates to a tester for a vehicle engine air bypass valve.

BACKGROUND OF THE INVENTION

In present vehicle engine design, the carburetor or fuel injection system is provided with an idle air computer system controlled by the vehicle engine control module (ECM). This comprises a fuel injection system of the throttle body injection type with an idle air inlet at the venturi adjacent the throttle valve. The volume of idle air inlet is controlled by an idle air valve which is actuated by a coil-type solenoid. The engine idle speed is controlled by the ECM in response to various engine parameters by controlling the energization of the solenoid. A pulse width modulator in the ECM produces pulses of variable width for energizing the solenoid for displacement control of the valve. Without pulse modulation, full power supplied to the solenoid would result in full opening of the valve and no power supplied to the solenoid would result in full closing of the valve. By pulse width modulation, the degree of opening may be controlled. A bias spring is attached to the valve to bias same to the closed position.

One tester for an idle air intake valve is disclosed in U.S. Pat. No. 4,764,727 issued Aug. 16, 1988 in the name of McConchie, Sr. A monitor circuit is inserted between the engine control module (ECM) and the idle air control motor of the air intake valve. The idle air control motor includes two separate coils to enable the valve to have stepping characteristics in two directions. A first pair of LEDs are connected to the first coil and a second pair of LEDs are connected to the second coil. The LEDs illuminate intermittently during normal operation and are held in one condition during abnormal operation.

A general object of this invention is to provide an improved idle air control system tester with a pulse width modulation monitor and a selective manual control circuit to overcome certain disadvantages of the prior art.

SUMMARY OF THE INVENTION

In accordance with this invention, a voltage monitor is connected between the engine computer module (ECM) and the electrical actuator of the air bypass valve for indicating the value of voltage applied to the actuator. This is accomplished by disconnecting the vehicle wiring harness from the actuator and inserting a test wiring harness therebetween in serial connection with the ECM and the actuator for measuring the effective voltage applied to the actuator.

Further in accordance with this invention, the tester includes a manually controlled variable duty cycle pulse generator for generating a test voltage to the actuator. A switch is connected between the ECM and manually controlled variable duty cycle pulse generator for alternatively connecting the ECM or the manually controlled variable duty cycle pulse generator to the actuator.

Further in accordance with this invention, the switching means comprises a single pole double throw switch in a return conductor of the test wiring harness. The switching means has a movable contact connected to the return terminal of the actuator with a first fixed contact connected to the ECM and a second fixed contact is connected to the manually controlled variable pulse modulator. The pulse generator preferably comprises a pulse width generator and the monitor comprises a bar graph display.

A complete understanding of this invention may be obtained from the detailed description that follows taken with the accompanying drawings.

DESCRIPTION OF THE PREFERRED EMBODIMENT

Figure 1:
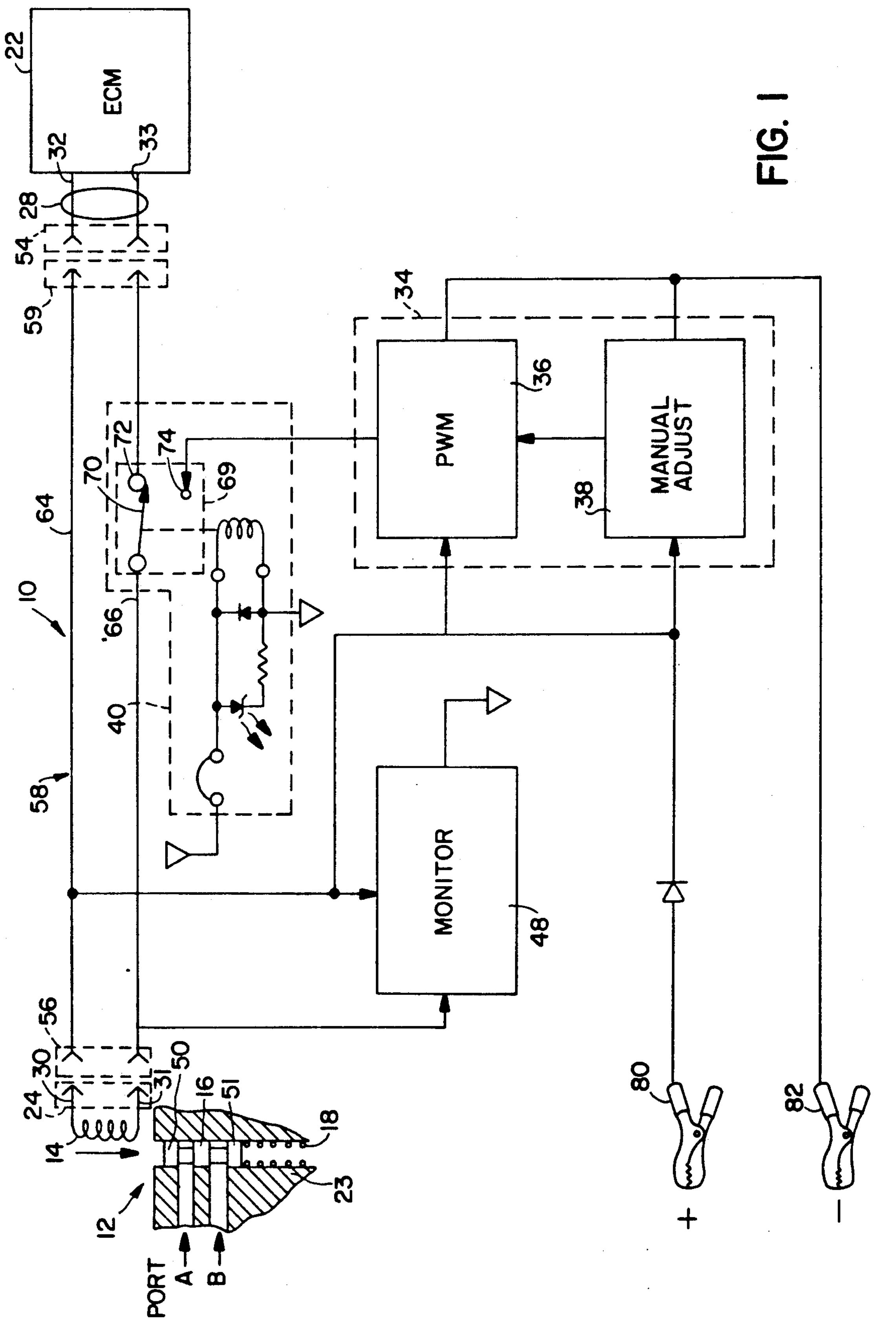
FIG. 1 is a block diagram of the tester in connection with the vehicle engine computer and the air bypass valve.

Referring now to the drawings, there is shown an illustrative embodiment of the invention in an air bypass valve tester for use with a vehicle engine idle air control system. It will be apparent as the description proceeds that the invention may be realized in different embodiments and is useful for other applications.

A tester 10 for testing the operation of an air bypass valve 12 in a conventional vehicle engine with an air idle control system is generally illustrated in FIG. 1. The tester 10 visually indicates proper operation and connection of the air bypass valve 12. The air bypass valve 12 moves between a plurality of positions between open and closed for controlling the air intake to an engine to control the idle speed of the engine. The air bypass valve 12 is used by Ford Motor Co. to control the revolutions per minute (RPM) at which the engine idles.

In a conventional vehicle engine, a vehicle engine computer module (ECM) 22 takes control of the engine RPM at idle via the air bypass valve 12 and establishes correct RPM based on the engine load and temperature when the operator is not requesting a given engine RPM, as described herein before. Fuel is injected through the fuel injector into the throttle valve. Air supply for engine idle operation is provided through the air bypass valve 12 to the downstream side of the throttle valve. The air bypass valve 12 includes a valve member 16 which is actuated by a coil-type solenoid 14 and biased in a reverse or closed direction by a spring 18 of conventional construction. The solenoid 14 is controlled by the ECM 22 which develops a control signal in accordance with engine parameters, such as load and temperature. The control signal of the ECM 22 is applied to a driver circuit, an integral part of the ECM, which produces a pulse width modulated signal for energization of the solenoid 14.

The input 24 of the solenoid 14 includes a solenoid supply terminal 30 and solenoid return terminal 31. The valve member 16 is slideable within a passageway 23 of the engine and includes apertures A and B therein to allow air intake to the vehicle engine. The valve member 16 includes radial recesses 50, 51 for aligning with the apertures A and B in the full open position allowing a maximum volume of air intake, and for misaligning with the apertures A and B when in the fully closed allowing no air intake. FIG. 1 illustrates the valve member 16 in the fully opened position.

In normal engine operation, the solenoid 14 is connected to the ECM 22 through a vehicle wiring harness 28. The vehicle wiring harness 28 includes a first disconnectible connector 54 which is connected to the input 24 of the solenoid 14. The computer output 26 includes a supply terminal 32 and return terminal 33 coupled to a supply 62 and return 62 conductor of the vehicle wiring harness 28, and in turn to the supply terminal 30 and return terminal 31 of the solenoid 14.

When evaluation or service is required on the engine idle air control system, the tester 10 is interjected for the evaluation thereof. The tester 10 includes a test wiring harness 58 having a second disconnectable connector 56 at one end adapted to be connected with the solenoid input 24 when the first disconnectable connector 54 is disconnected from the solenoid 14, and a third disconnectable connector 59 at a second end of the test wiring harness 58 adapted to be connected to the first disconnectable connector 54 when disconnected from the solenoid input 24. It is to be understood that the test wiring harness 58 may be connected at any position between the solenoid 14 and the ECM 22.

The test wiring harness 58 includes a test supply conductor 64 and return conductor 66 connected through the second 56 and third 59 disconnectable connectors to the computer supply terminal 32 and return terminal 33 and to the solenoid supply terminal 30 and return terminal 31, respectively.

The tester 10 includes a manually controlled variable duty cycle pulse generator 34 for generating a variable duty cycle test voltage. In the preferred embodiment, the manually controlled pulse modulator 34 includes a pulse width modulator 36 for producing the test signal comprising pulses of modulated width at a predetermined frequency, generally 160 HZ. The manually controlled variable pulse modulator 34 also includes manual adjustment means 38 for selectively adjusting the pulse width of the test signal to vary the degree of opening of the air bypass valve 12. It is to be understood that it is within realm of the instant invention to incorporate duty cycle control rather than pulse width modulation to control the degree of opening of the valve 16.

The tester 10 includes switch means 40 in the test wiring harness 58 for selectively connecting the solenoid 14 through the tester wiring harness 58 to either the engine computer 22 or the manually controlled pulse modulator 34 whereby either the control voltage or the test voltage may be applied to the solenoid 14. The switch means 40 comprises a single pole double throw switch 69 having a movable contact 70 connected to the test return conductor 66 and switchable between a first fixed contact 72 connected to the computer return terminal 33 and a second fixed contact 74 connected to the output of the pulse width modulator 36.

The tester 10 also includes a voltage monitor 48 connected within the test wiring harness 58 for indicating the value of voltage applied to the solenoid 14 by the engine computer 22 or by the manually controlled pulse modulator 34 indicative of the position of the air bypass valve 12. The voltage monitor means 48 comprises a bar graph display for indicating the effective voltage applied to the solenoid 14 representative of the position of the valve 16. The voltage monitor 48 is connected across the solenoid input 24 by connection to the test supply conductor 64 and return conductor 66.

The tester 10 is connected to the terminals of a vehicle battery (not shown) for supplying power thereto. The positive battery terminal is connected via an electrically conducting clamp 80 to the test supply conductor 64 and the negative battery terminal is connected via a second clamp 82 to the manually controlled variable pulse modulator 34.

In operation, the tester 10 is interjected into the vehicle harness 28 by disconnecting the first disconnectable connector 54, and connecting the second disconnectable connector 56 to the input 24 of the solenoid 14 and connecting the third disconnectable connector 59 to the first disconnectable connector 54, or alternatively directly to the output 26 of the ECM 22. The operator switches between the ECM 22 and the manually controlled pulse modulator 34 connecting same to the solenoid 14 to monitor the voltage monitor 48 to evaluate operation of the air bypass valve 12. The voltage monitor 48 indicates change in position of the valve member 16 by a displayed change in voltage. To ensure movement of the valve member 16, the manually controlled pulse modulator 34 is connected by the switch means 40 and adjusted to ensure a similar response by the voltage monitor 48 and therefore the valve member 16. To ensure proper connections and operation of the engine computer 22, the engine computer 22 is connected by the switch means 40 and the voltage monitor 48 is monitored to determine change in voltage.

Figure 2:
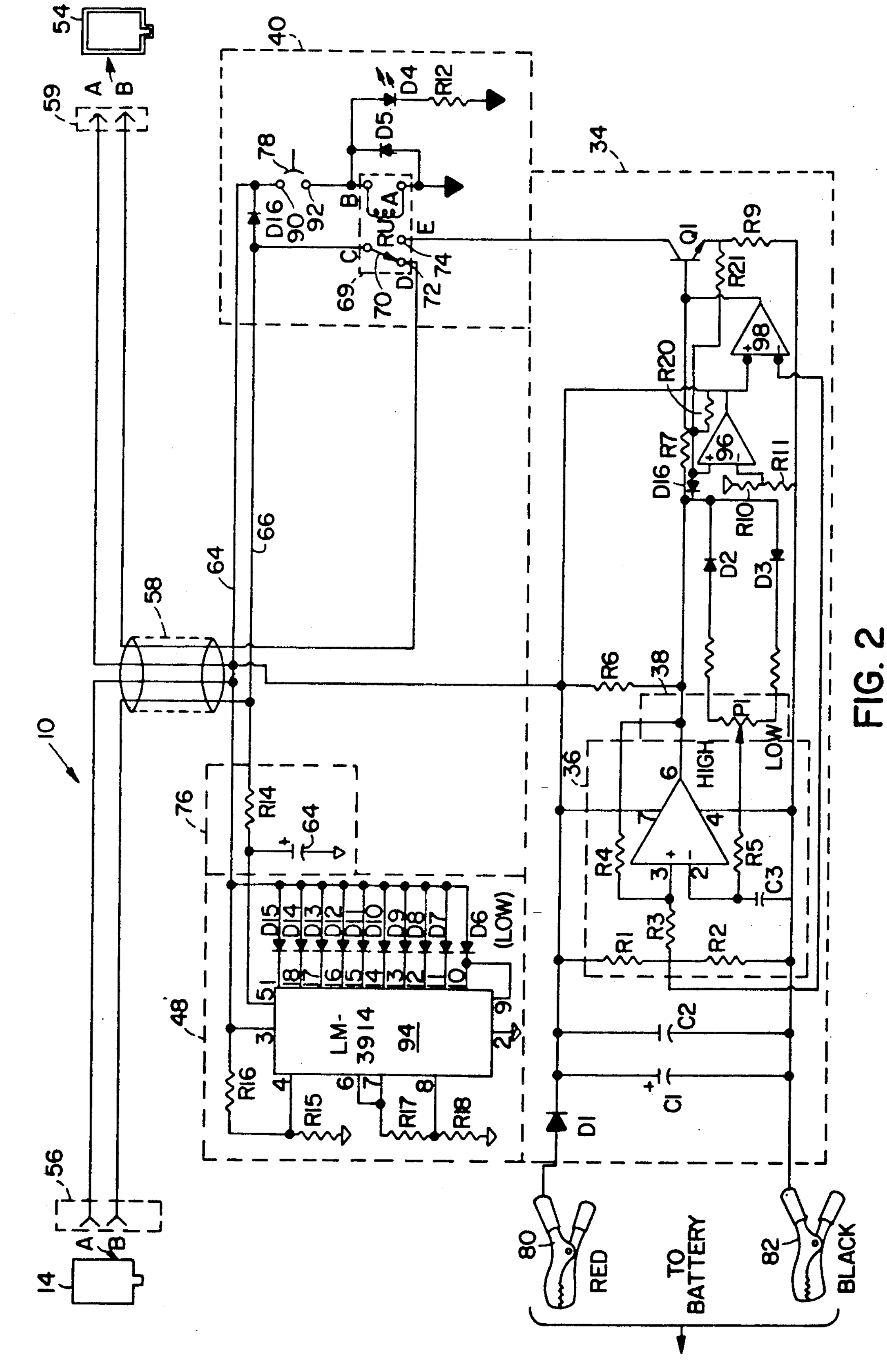
FIG. 2 is a schematic diagram of the specific circuitry of the tester.

FIG. 2 is a schematic diagram of the tester 10. The manually controlled pulse modulator 34 includes a protection diode D1 receiving the positive battery supply via the first clamp 80 and connected to the test supply conductor 64. Parallel capacitors C1 and C2 are connected across the vehicle battery terminals and clamps 80, 82 for eliminating noise thereon. The pulse width modulator comprises an oscillator which includes a voltage divider established by resistor R2 connected to the diode D1 and resistor R1 connected to the second clamp 82. Resistor R3 is connected between resistors R1, R2 and to the noninverting input of an operational amplifier 86. Feedback is provided by resistor R4 connected between the noninverting input and the output of the operational amplifier 86. The inverting input is connected through capacitor C3 to the second clamp 82 to establish the frequency of the oscillator 36, and is connected through resistor R5 to a potentiometer P1 comprising the manual adjustment means 38. The potentiometer P1 is connected to diodes D2, D3, and to the output of the operational amplifier 86. The output of the operational amplifier 86 is connected through resistor R7 to the base of a switching transistor Q1. Resistor R8 is connected between the base and the output of amplifier 96, and an emitter resistor R9 connects the emitter to the second clamp 82. Resistor R6 is connected to the output of the operational amplifier 86 and to the first clamp 80. A protection network comprising a operational amplifier 96 and trigger operational amplifier 98 protects the transistor Q1 from overload due to short circuiting. The threshold operational amplifier 96 has its inverting input connected to a voltage divider comprising resistors R10 and R11 and its noninverting input connected to the emitter of the transistor Q1 through resistor R21 and to a diode D16 to the output of operational amplifier 86 output. Feedback is provided by resistor R20 between the output of threshold operational amplifier 96 and the noninverting input. The trigger operational amplifier 98 receives the output from the threshold operational amplifier 96 at its noninverting input and receives the output of voltage divider comprising resistors R1 and R2 at its inverting input.

The output of amplifier 98 is connected to the base of transistor Q1. The collector of the transistor Q1 is connected to the second fixed contact 74 of the switch 69 to provide the test signal.

The switch means 40 includes a push button switch 78 which is manually operable between a computer controlled position with the movable contact 70 in connection with the first fixed contact 72, and a manual controlled position with the movable contact 70 in connection with the second fixed contact 74. The push button switch 78 is connected between the test supply conductor 64 and a relay RL1 for controlling the movable contact 70. The push button switch 78 moves the contact 70 from the computer controlled position to the manual controlled position upon depression thereof by energizing the relay RL1. The push button switch 78 includes a first contact 90 connected to the test supply conductor 64 and to diode D16 to the test return conductor 66, and a second contact 92 connected to the relay RL1. A light emitting diode D4 (LED) and a resistor R12 is connected in parallel with the relay RL1 to emit light upon closing of the push button switch 78 and energization of the relay RL1 to indicate the tester 10 is under manual control. A diode D5 is provided across relay RL1 to deenergize same upon release of the push button switch 78.

A low pass filter 76 is connected to the test return conductor 64 to the input of the bar graph display 48 which smooths the received voltage signal to produce a substantially DC level to the bar graph display 48. The bar graph display 48 includes a plurality of LEDs D6-15 for illuminating to indicate magnitude of the received DC level.

The bar graph display 48 comprises a LM3914 integrated circuit chip 94. The reference input pin 3 connected to the test supply conductor 64 and its variable or measured input is at pin 5. Pin 5 receives the input through the low pass filter 76 comprising a resistor R14 and capacitor C4 connected to the solenoid return conductor 66. The plurality of LEDs are provided at pins 1 (high), 18, 17, 16, 15, 14, 13, 12, and 10 (low) and connected to the supply conductor 64. Pin 10 is connected to pin 9. Pin 2 is grounded. Pin 4 is connected through a resistor R15 to ground and through resistor R16 to pin 3. Pins 6 and 7 are connected through resistor R17 to pin 8, and pin 8 is connected through resistor R18 to ground.

In more specific operation, when the tester wiring harness 58 is connected with the vehicle wiring harness 28 and solenoid 14 as previously discussed, the movable contact 70 is in contact with contact 72 to provide the control signal from the ECM 22 through the tester 10 to the solenoid 14. Operation of the ECM 22 is monitored by the display of the control signal on the bar graph 48. Thereafter, push button 78 may be depressed to allow current to flow to relay RL1 for energization thereof and to diode D4 for illumination thereof. Upon energization of the relay RL1, movable contact 70 is moved in connection with contact 74 to provide manual control of energization of the solenoid 14 by the pulse width modulator 36. The potentiometer P1 may be operated to adjust the pulse width and therefore the voltage applied to the solenoid 14 while the bar graph 48 displays change in monitored voltage or pulse width. The "low" LED D6 is illuminated upon reception of a high DC level, i.e., 12 volts, and the "high" LED D15 is illuminated upon reception of a low DC level. No LEDs D6-15 are lit when a zero voltage level is received. The bar graph display 48 indicates a first failure by visually indicating when the connections to air bypass valve 12 have short circuited. The low LED D6 will illuminate upon this condition. A second failure is indicated by the bar graph display 48 by visually indicating when the connections to air bypass valve 12 is open circuited. No LED D6-D15 will illuminated upon this condition.

The threshold operational amplifier 96 senses the voltage across resistor R9 and compares same to a setpoint established by the resistive divider R10, R11 to detect a short circuit Upon detection of a short circuit, the comparing operational amplifier 96 triggers the trigger operational amplifier 98 which turns off the transistor Q1 on each cycle of the oscillator 86.

The invention has been described in an illustrative manner, and it is to be understood that the terminology which has been used is intended to be in the nature of words of description rather than of limitation.

Obviously, many modifications and variations of the present invention are possible in light of the above teachings. It is, therefore, to be understood that within the scope of the appended claims wherein reference numerals are merely for convenience and are not to be in any way limiting, the invention may be practiced otherwise than as specifically described.

What is claimed is:

1. A tester for a vehicle engine idle air control system which includes an air bypass valve having an electrical actuator with an input responsive to a pulse modulated voltage for controlling the degree of opening of the valve in accordance with the modulation of the pulse modulated voltage and which includes a vehicle engine computer responsive to engine parameters and having an output for producing a variable control voltage for energizing the actuator, the computer output being coupled to the actuator input through a vehicle wiring harness including a first disconnectable connector, said tester including:

a manually controlled variable duty cycle pulse generator for generating a test voltage, a test wiring harness having a second disconnectable connector at one end adapted to be connected with said actuator input when said first disconnectable connector is disconnected from the actuator and a third disconnectable connector at a second end of said test wiring harness adapted to be connected with said computer output when said first disconnectable connector is disconnected, switch means connected in said tester wiring harness for selectively connecting said actuator through said test wiring harness to said engine computer or to said manually controlled pulse generator whereby either said control voltage or said test voltage may be applied to said actuator, and a voltage monitor connected with said test wiring harness for indicating the value of voltage applied to said actuator by said engine computer or by said manually controlled variable pulse generator.

2. The invention as defined in claim 1 wherein said computer output comprises a supply terminal and a return terminal, said actuator input comprises a supply terminal and a return terminal, said test wiring harness comprises a tester supply conductor and a tester return conductor extending, respectively, between said supply terminals and said return terminals with said second and third disconnectable connectors connected to said actuator input and said computer output, said switching means comprising a single pole double throw switch connected in said return conductor and having a movable contact connected with said return terminal of said actuator, a first fixed contact connected with said return contact of said computer and a second fixed contact connected with the output of said manually controlled variable pulse generator.

3. The invention as defined in claim 1 wherein said pulse generator comprises a pulse width modulator.

4. The invention as defined in claim 1 wherein said voltage monitor comprises a bar graph display comprising a series of light emitting diodes for illuminating to indicate the value of voltage applied to said actuator representative of the degree of opening of said air bypass valve, and for indicating the occurrence of a short circuit and an open circuit of the connection with said actuator.

5. The invention as defined in claim 1 wherein said manually controlled variable pulse modulator includes an oscillator to produce said test voltage comprising pulses at a predetermined frequency and a manual adjustment means for varying the width of said pulses, said oscillator controlling a switching transistor for connecting and disconnecting said test voltage to said actuator, and a protection circuit connected across said switching transistor for sensing overload in case of short circuiting to disconnect said test voltage.

* * * * *